(12) United States Patent
Gejo et al.

(10) Patent No.: US 11,837,654 B2
(45) Date of Patent: Dec. 5, 2023

(54) METHOD FOR CONTROLLING SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Ryohei Gejo, Kawasaki Kanagawa (JP); Tatsunori Sakano, Tokyo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 18/068,768

(22) Filed: Dec. 20, 2022

(65) Prior Publication Data

US 2023/0123438 A1    Apr. 20, 2023

Related U.S. Application Data

(63) Continuation of application No. 17/015,773, filed on Sep. 9, 2020, now Pat. No. 11,563,112.

(30) Foreign Application Priority Data

Nov. 1, 2019    (JP) .................................. 2019-119660

(51) Int. Cl.
*H01L 29/739*    (2006.01)
*H02M 1/08*    (2006.01)
(Continued)

(52) U.S. Cl.
CPC .......... *H01L 29/7397* (2013.01); *H02M 1/08* (2013.01); *H02M 3/003* (2021.05); *H02M 7/003* (2013.01);
(Continued)

(58) Field of Classification Search
CPC .. H01L 29/7397; H02M 3/003; H02M 7/5387
See application file for complete search history.

(56) References Cited

U.S. PATENT DOCUMENTS

| 8,248,116 B2 | 8/2012 | Soeno et al. |
| 2011/0001553 A1 | 1/2011 | Soeno et al. |

(Continued)

FOREIGN PATENT DOCUMENTS

| JP | 2010-11609 A | 1/2010 |
| JP | 2011-96852 A | 5/2011 |

(Continued)

*Primary Examiner* — Alex Torres-Rivera
(74) *Attorney, Agent, or Firm* — Finnegan, Henderson, Farabow, Garrett & Dunner, LLP (57) ABSTRACT

A semiconductor device includes first and second electrodes, a semiconductor part therebetween, and a control electrode between the semiconductor part and the first electrode. The semiconductor part includes first, third and fifth layers of a first conductivity type and second and fourth layers of a second conductivity type. The second layer is provided between the first layer and the first electrode. The third layer is provided between the second layer and the first electrode. The fourth layer and the fifth layer are selectively provided between the first layer and the second electrode. In a method for controlling the semiconductor device, first to third voltages are applied in order to the control electrode while a p-n junction between the first and second layers is biased in a forward direction. The second and third voltages are greater than the first voltage, and the third voltage is less than the second voltage.

20 Claims, 7 Drawing Sheets

(51) Int. Cl.
*H03K 17/16* (2006.01)
*H02M 7/5387* (2007.01)
*H02M 3/00* (2006.01)
*H02M 7/00* (2006.01)
*H02M 1/00* (2006.01)

(52) U.S. Cl.
CPC ........ *H02M 7/5387* (2013.01); *H03K 17/168* (2013.01); *H02M 1/0054* (2021.05)

(56) References Cited

U.S. PATENT DOCUMENTS

| | | |
|---|---|---|
| 2013/0207712 A1 | 8/2013 | Suzuki et al. |
| 2016/0190123 A1 | 6/2016 | Laven et al. |
| 2016/0308524 A1 | 10/2016 | Inoue et al. |
| 2018/0183433 A1* | 6/2018 | Ojima .............. H03K 17/04206 |
| 2018/0308757 A1 | 10/2018 | Kakimoto |
| 2019/0051648 A1 | 2/2019 | Kakimoto et al. |
| 2020/0098903 A1* | 3/2020 | Satoh ................. H01L 29/7397 |

FOREIGN PATENT DOCUMENTS

| | | |
|---|---|---|
| JP | 5454146 B2 | 3/2014 |
| JP | 5532062 B2 | 6/2014 |
| JP | 2016-92163 A | 5/2016 |
| JP | 5935768 B2 | 6/2016 |
| JP | 5939281 B2 | 6/2016 |
| JP | 2016-154218 A | 8/2016 |
| JP | 2017-139328 A | 8/2017 |
| JP | 6337615 B2 | 6/2018 |
| JP | 6350298 B2 | 7/2018 |
| JP | 6414090 B2 | 10/2018 |
| WO | WO 2009/101868 A1 | 8/2009 |

* cited by examiner

METHOD FOR CONTROLLING SEMICONDUCTOR DEVICE

CROSS-REFERENCE TO RELATED APPLICATIONS

This application is a continuation of U.S. patent application Ser. No. 17/015,773, filed Sep. 9, 2020, which is based upon and claims the benefit of priority from Japanese Patent Application No. 2019-119660, filed on Nov. 1, 2019; the entire contents of which are incorporated herein by reference.

FIELD

Embodiments relate to a method for controlling a semiconductor device.

BACKGROUND

A reverse-conducting IGBT (Insulated Gate Bipolar Transistor) in which an IGBT and a diode are integrated is widely used as a power control semiconductor device. In such a semiconductor device, reducing the switching loss of the diode causes the conduction loss to increase.

DETAILED DESCRIPTION

According to one embodiment, a semiconductor device including a semiconductor part including a first surface and a second surface, the second surface being at a side opposite to the first surface; a first electrode provided on the first surface of the semiconductor part; a second electrode provided on the second surface of the semiconductor part; and at least one control electrode being provided between the semiconductor part and the first electrode. The control electrode is disposed inside a trench provided at the first surface side of the semiconductor part. The control electrode is electrically insulated from the semiconductor part by a first insulating film and electrically insulated from the first electrode by a second insulating film. The semiconductor part includes a first semiconductor layer of a first conductivity type, a second semiconductor layer of a second conductivity type, a third semiconductor layer of the first conductivity type, a fourth semiconductor layer of the second conductivity type, and a fifth semiconductor layer of the first conductivity type. The second semiconductor layer is provided between the first semiconductor layer and the first electrode, the second semiconductor layer including a portion facing the control electrode via the first insulating film. The third semiconductor layer is selectively provided between the second semiconductor layer and the first electrode, the third semiconductor layer contacting the first insulating film. The fourth semiconductor layer is selectively provided between the first semiconductor layer and the second electrode. The fifth semiconductor layer is selectively provided between the first semiconductor layer and the second electrode, the fourth and fifth semiconductor layers being arranged along the second electrode. The first electrode is electrically connected to the second and third semiconductor layers. The second electrode is electrically connected to the fourth and fifth semiconductor layers. The semiconductor device having a p-n junction between the first semiconductor layer and the second semiconductor layer. A method for controlling a semiconductor device includes applying a first control voltage between the first electrode and the control electrode in a first period, while the p-n junction is biased in a forward direction before the p-n junction becomes biased in a reverse direction; applying a second control voltage between the first electrode and the control electrode in a second period after the first period and before the p-n junction becomes biased in the reverse direction, the second control voltage being greater than the first control voltage; and applying a third control voltage between the first electrode and the control electrode in a third period after the second period until the p-n junction is biased in the reverse direction, the third control voltage being greater than the first control voltage and less than the second control voltage.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
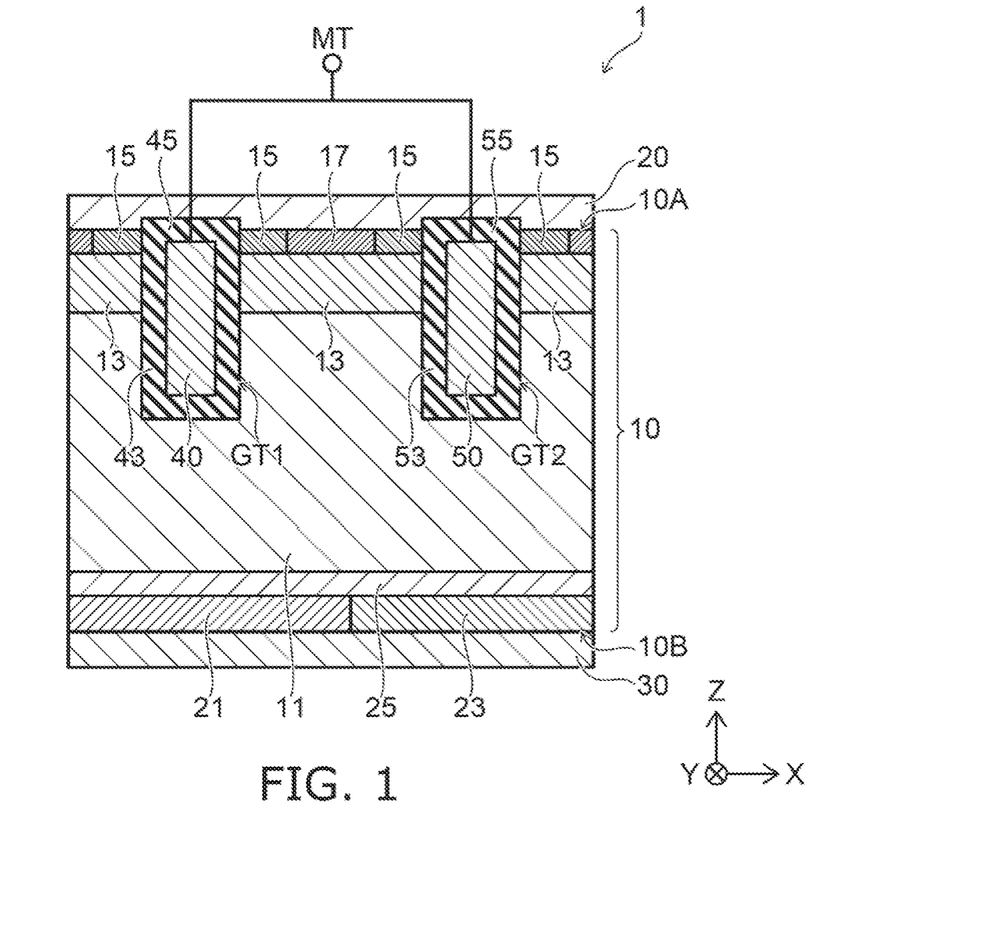
FIG. 1 is a schematic cross-sectional view showing a semiconductor device according to an embodiment.

FIG. 1 is a schematic cross-sectional view showing a semiconductor device 1 according to an embodiment. The semiconductor device 1 is, for example, a reverse-conducting IGBT (RC-IGBT).

The semiconductor device 1 includes a semiconductor part 10, a first electrode 20, and a second electrode 30. The semiconductor part 10 is, for example, silicon. The first electrode 20 is provided on a first surface 10A of the semiconductor part 10. The first electrode 20 is, for example, an emitter electrode. The first electrode 20 is, for example, a metal layer including aluminum (Al). The second electrode 30 is provided on a second surface 10B of the semiconductor part 10. The second surface 10B is, for example, the back surface of the semiconductor part 10 and is positioned at the side opposite to the first surface 10A. The second electrode 30 is, for example, a collector electrode. The second electrode 30 is, for example, a metal layer including titanium (Ti) or aluminum (Al).

The semiconductor device 1 further includes a first control electrode 40 and a second control electrode 50. The first control electrode 40 and the second control electrode 50 are provided between the semiconductor part 10 and the first electrode 20. The first control electrode 40 and the second control electrode 50 are, for example, conductive polysilicon.

The first control electrode 40 is disposed inside a trench GT1 provided at the first surface 10A side of the semiconductor part 10. The first control electrode 40 is electrically insulated from the semiconductor part 10 by a first insulating film 43. Also, the first control electrode 40 is electrically insulated from the first electrode 20 by a second insulating film 45. The first insulating film 43 and the second insulating film 45 are, for example, silicon oxide films. For example, the first control electrode 40 is electrically connected to a first control terminal MT.

The second control electrode 50 is disposed inside a trench GT2 provided at the first surface 10A side of the semiconductor part 10. The second control electrode 50 is electrically insulated from the semiconductor part 10 by a third insulating film 53. Also, the second control electrode 50 is electrically insulated from the first electrode 20 by a fourth insulating film 55. The third insulating film 53 and the fourth insulating film 55 are, for example, silicon oxide films. For example, the second control electrode 50 is electrically connected to the first control terminal MT with the first control electrode 40. The same control voltage as the first control electrode 40 is applied to the second control electrode 50.

The semiconductor part 10 includes a first-conductivity-type (hereinbelow, n-type) first semiconductor layer 11, a second-conductivity-type (hereinbelow, p-type) second semiconductor layer 13, an n-type third semiconductor layer 15, a p-type fourth semiconductor layer 21, and an n-type fifth semiconductor layer 23.

The first semiconductor layer 11 is, for example, an n-type base layer. The first semiconductor layer 11 includes, for example, an n-type impurity with a low concentration ($1 \times 10^{13}$ to $1 \times 10^{15}$ cm$^{-3}$).

The second semiconductor layer 13 is, for example, a p-type base layer. The second semiconductor layer 13 is provided between the first semiconductor layer 11 and the first electrode 20. The second semiconductor layer 13 includes a portion facing the first control electrode 40 via the first insulating film 43 and a portion facing the second control electrode 50 via the third insulating film 53.

The third semiconductor layer 15 is, for example, an n-type emitter layer. The third semiconductor layer 15 is selectively provided between the second semiconductor layer 13 and the first electrode 20. For example, multiple third semiconductor layers 15 are provided respectively at positions contacting the first insulating film 43 and the third insulating film 53. The third semiconductor layer 15 includes an n-type impurity with a higher concentration than the n-type impurity of the first semiconductor layer 11. For example, the first electrode 20 is in contact with and electrically connected to the third semiconductor layer 15.

The fourth semiconductor layer 21 is, for example, a p-type collector layer. The fourth semiconductor layer 21 is selectively provided between the first semiconductor layer 11 and the second electrode 30. The fourth semiconductor layer 21 includes, for example, a p-type impurity with the same concentration level as the p-type impurity of the second semiconductor layer 13.

The fifth semiconductor layer 23 is, for example, an n-type cathode layer. The fifth semiconductor layer 23 is selectively provided between the first semiconductor layer 11 and the second electrode 30. The fifth semiconductor layer 23 includes an n-type impurity with a higher concentration than the n-type impurity of the first semiconductor layer 11.

The fourth semiconductor layer 21 and the fifth semiconductor layer 23 are alternately arranged along the second electrode 30. The second electrode 30 is electrically connected to the fourth and fifth semiconductor layers 21 and 23. Also, the second electrode 30 is electrically connected to the first semiconductor layer 11 via the fifth semiconductor layer 23.

The semiconductor part 10 further includes a sixth semiconductor layer 17 and a seventh semiconductor layer 25. The sixth semiconductor layer 17 is, for example, a p-type emitter layer. The seventh semiconductor layer 25 is, for example, an n-type buffer layer.

The sixth semiconductor layer 17 is selectively provided between the second semiconductor layer 13 and the first electrode 20. The sixth semiconductor layer 17 includes a p-type impurity with a higher concentration than the p-type impurity of the second semiconductor layer 13. For example, the first electrode 20 is in contact with and electrically connected to the sixth semiconductor layer 17. The first electrode 20 is electrically connected to the second semiconductor layer 13 via the sixth semiconductor layer 17.

The seventh semiconductor layer 25 is provided between the first semiconductor layer 11 and the fourth semiconductor layer 21. The seventh semiconductor layer 25 includes an n-type impurity with a higher concentration than the n-type impurity of the first semiconductor layer 11. By disposing the seventh semiconductor layer 25, for example, the depletion layer can be prevented from spreading to the fourth semiconductor layer 21 at turn-off in the IGBT mode.

Figure 2A:
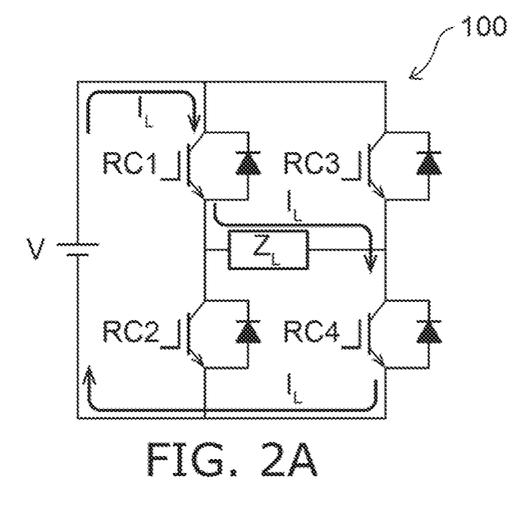
FIGS. 2A and 2B are circuit diagrams showing a power conversion circuit using the semiconductor device according to the embodiment.
Figure 2B:
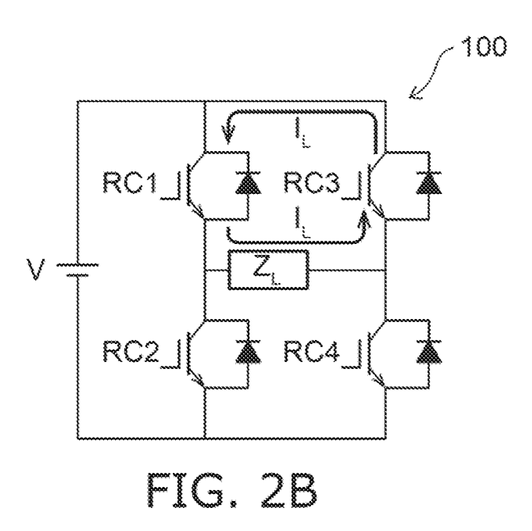

FIGS. 2A and 2B are circuit diagrams showing a power conversion circuit 100 using the semiconductor device 1 according to the embodiment. FIGS. 2A and 2B are circuit diagrams illustrating a single-phase inverter circuit including four semiconductor devices 1 (hereinbelow, semiconductor devices RC1 to RC4).

As shown in FIGS. 2A and 2B, the semiconductor devices RC1 and RC3 are arranged in parallel in arms at the high potential side, and the semiconductor devices RC2 and RC4 are arranged in parallel in arms at the low potential side. The switching control of the semiconductor devices RC1 to RC4 is performed to cause an AC current of a prescribed frequency to flow in a load $Z_L$. The load $Z_L$ is, for example, an inductor.

FIGS. 2A and 2B show processes of the waveform control of a current $I_L$ flowing in the load $Z_L$. For example, the controls shown in FIGS. 2A and 2B are alternately performed so that the waveform of the current $I_L$ flowing in the load $Z_L$ approaches a sine wave.

In the process shown in FIG. 2A, the semiconductor devices RC1 to RC4 operate in the IGBT mode, the semiconductor devices RC1 and RC4 are in the on-state, and the semiconductor devices RC2 and RC3 are in the off-state. The current $I_L$ is supplied from a power supply V to the load $Z_L$. At this time, the current $I_L$ flows through a path via the semiconductor devices RC1 and RC4.

In the process shown in FIG. 2B, the semiconductor device RC4 is turned off, and the semiconductor device RC1 is maintained in the on-state. The semiconductor device RC2 is maintained in the off-state. Thereby, the supply of the current $I_L$ from the power supply V is stopped, but the current $I_L$ continues to flow while gradually decreasing due to the electrical energy stored in the load $Z_L$. At this time, the current $I_L$ flows through a path via the semiconductor devices RC3 and RC1. The p-n junction between the first semiconductor layer 11 and the second semiconductor layer 13 in the semiconductor device RC3 (referring to FIG. 1) is biased in the forward direction by an electromotive force generated in the load $Z_L$. In other words, the semiconductor device RC3 forms a path of the current $I_L$ by operating in the diode mode.

Continuing, the semiconductor device RC4 is again turned on. Thereby, the process returns to the process shown in FIG. 2A, and the current $I_L$ is supplied from the power supply V to the load $Z_L$ by the path via the semiconductor devices RC1 and RC4. The semiconductor device RC2 is maintained in the off-state. The semiconductor device RC3 transitions from the diode mode to the IGBT mode and is switched to the off-state.

Subsequently, the semiconductor device RC4 is again turned off, and the process returns to the process shown in FIG. 2B. Thus, by switching the semiconductor device RC4 on and off, the processes shown in FIGS. 2A and 2B are alternately repeated, and the waveform of the current $I_L$ is controlled.

To control a current flowing in the load $Z_L$ in the reverse direction of the current $I_L$ shown in FIGS. 2A and 2B, the semiconductor device RC3 is repeatedly switched on and off in a state in which the semiconductor device RC1 is set to the off-state and the semiconductor device RC2 is turned on. Accordingly, the semiconductor device RC4 alternately repeats the operations of the IGBT mode and the diode mode.

Figure 3A:
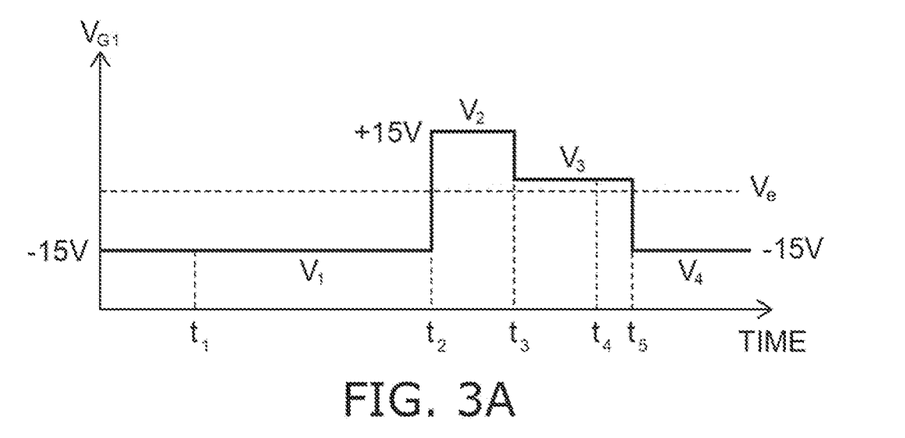
FIGS. 3A and 3B are timing charts showing a method for controlling the semiconductor device according to the embodiment.
Figure 3B:
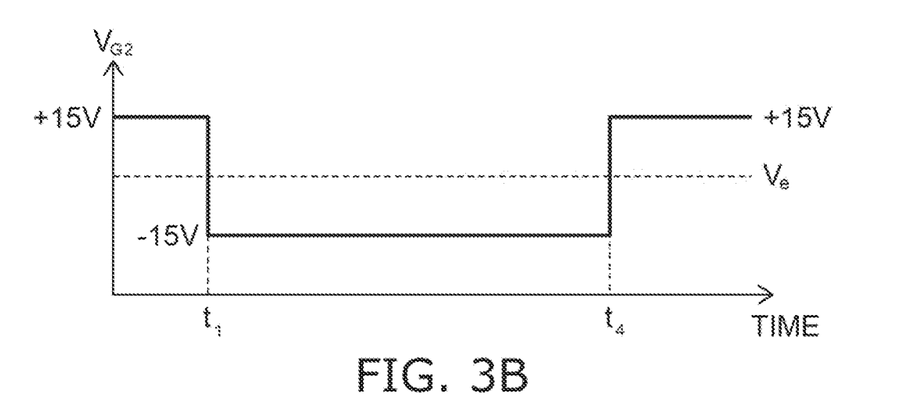

FIGS. 3A and 3B are timing charts showing a method for controlling the semiconductor device 1 according to the embodiment.

FIG. 3A illustrates a control voltage $V_{G1}$ applied between the first control terminal MT and the first electrode 20 of the semiconductor device RC3 when returning to the process shown in FIG. 2A after performing the process shown in FIG. 2A and the process shown in FIG. 2B.

FIG. 3B illustrates a control voltage $V_{G2}$ applied between the first control terminal MT and the first electrode 20 of the semiconductor device RC4 when returning to the process shown in FIG. 2A after performing the process shown in FIG. 2A and the process shown in FIG. 2B.

"Ve" shown in FIGS. 3A and 3B is the potential of the first electrode 20.

As shown in FIG. 3A, a first control voltage $V_1$, e.g., negative 15 V is applied to the first control terminal MT of the semiconductor device RC3. Continuing, at a time $t_2$, the control voltage $V_{G1}$ is increased to a second control voltage $V_2$, e.g., positive 15 V. At a time $t_3$, the control voltage $V_{G1}$ is reduced to a third control voltage $V_3$, e.g., 1 to 2 V. Continuing, at a time $t_5$, the control voltage $V_{G1}$ is further reduced to a fourth control voltage $V_4$, e.g., negative 15 V.

On the other hand, as shown in FIG. 3B, for example, the control voltage $V_{G2}$ of positive 15 V is applied to the first control terminal of the semiconductor device RC4, and the control voltage $V_{G2}$ is reduced to negative 15 V at a time $t_1$ before the time $t_2$. The threshold voltages of the first and second control electrodes 40 and 50 of the semiconductor device RC4 are not more than positive 15 V and not less than negative 15 V. Continuing, the control voltage $V_{G2}$ is returned to positive 15 V at a time $t_4$, which is between the time $t_3$ and the time $t_5$.

In the control method shown in FIGS. 3A and 3B, the semiconductor device RC4 is in the on-state in the period before the time $t_1$ and is turned off at the time $t_1$. The semiconductor device RC4 is in the off-state in the period from the time $t_1$ to the time $t_4$ and is turned on at the time $t_4$. In other words, the supply of the current $I_L$ from the power supply V is stopped between the time $t_1$ and the time $t_4$ (referring to FIG. 2B).

The semiconductor device RC3 operates in the IGBT mode in the period before the time $t_1$ and operates in the diode mode between the time $t_1$ and the time $t_4$. Continuing, the operation returns to the operation of the IGBT mode at the time $t_4$.

As shown in FIG. 3A, the first control voltage $V_1$, the second control voltage $V_2$, and the third control voltage $V_3$ are applied in order to the first control terminal MT of the semiconductor device RC3 between the time $t_1$ and the time $t_4$.

The first control voltage $V_1$ is, for example, a negative voltage that induces p-type inversion layers at the interface between the first semiconductor layer 11 and the first insulating film 43 and at the interface between the first semiconductor layer 11 and the third insulating film 53.

The second control voltage $V_2$ is, for example, greater than the threshold voltages of the first and second control electrodes 40 and 50 and induces n-type inversion layers at the interface between the second semiconductor layer 13 and the first insulating film 43 and at the interface between the second semiconductor layer 13 and the third insulating film 53.

The third control voltage $V_3$ is greater than the first control voltage $V_1$ and less than the second control voltage $V_2$. The third control voltage $V_3$ is a voltage of a level that does not induce p-type inversion layers at the interfaces between the first semiconductor layer 11 and the first and third insulating films 43 and 53 and does not induce n-type inversion layers at the interfaces between the second semiconductor layer 13 and the first and third insulating films 43 and 53.

The timing (the time $t_3$) of reducing the second control voltage $V_2$ to the third control voltage $V_3$ is set to be before the timing (the time $t_4$) of the semiconductor device RC3 transitioning from the diode mode to the IGBT mode. For example, if the semiconductor device RC4 is turned on and the semiconductor device RC3 transitions from the diode mode to the IGBT mode in the state in which the second control voltage $V_2$ is applied to the first control terminal MT of the semiconductor device RC3, there is a risk that the semiconductor devices RC3 and RC4 may be simultaneously turned on and the power supply V may be shorted. The time $t_3$ is set to be before the time $t_4$ to avoid such a short-circuit.

Figure 4A:
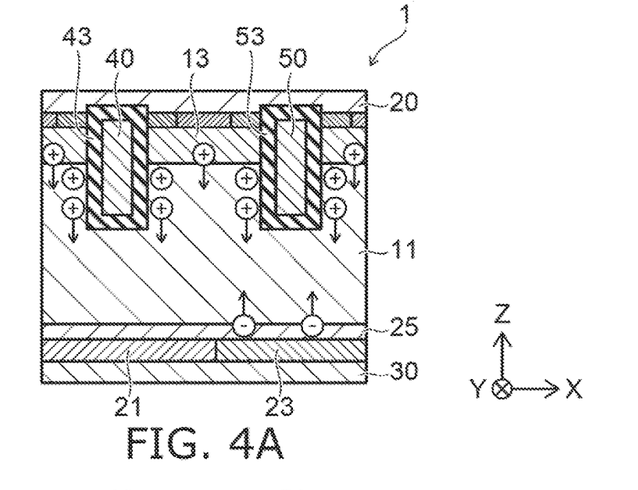
FIGS. 4A to 4C are schematic cross-sectional views showing operations of the semiconductor device according to the embodiment.
Figure 4B:
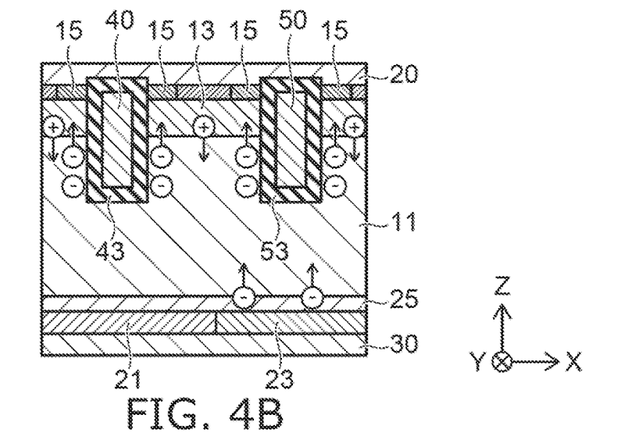
Figure 4C:
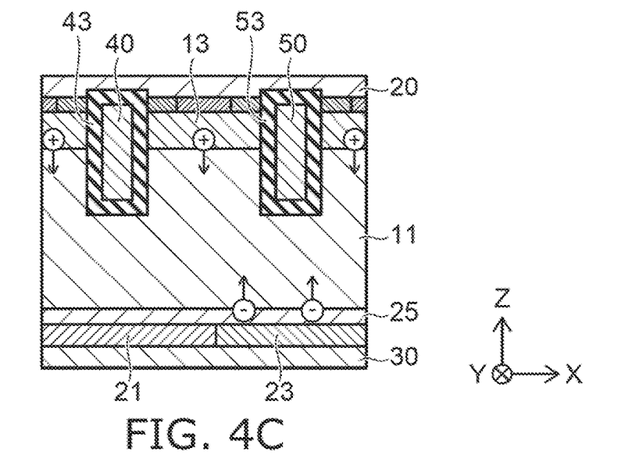

FIGS. 4A to 4C are schematic cross-sectional views showing operations of the semiconductor device 1 according to the embodiment in the diode mode.

FIG. 4A corresponds to the operation of the semiconductor device RC3 in the times $t_1$ to $t_2$. FIG. 4B corresponds to the operation of the semiconductor device RC3 in the times $t_2$ to $t_3$. FIG. 4C corresponds to the operation of the semiconductor device RC3 in the times $t_3$ to $t_4$.

In the diode mode of the semiconductor device 1, a p-n junction between the second semiconductor layer 13 and the first semiconductor layer 11 is biased in the forward direction, and holes are injected from the second semiconductor layer 13 into the first semiconductor layer 11. Accordingly, electrons are injected from the fifth semiconductor layer 23 into the first semiconductor layer 11 via the seventh semiconductor layer 25.

As shown in FIG. 4A, p-type inversion layers are induced at the interface between the first semiconductor layer 11 and the first insulating film 43 and at the interface between the first semiconductor layer 11 and the third insulating film 53 when the first control voltage $V_1$, e.g., negative 15 V is applied to the first and second control electrodes 40 and 50. Thereby, the injection of holes from the second semiconductor layer 13 via the p-type inversion layers is promoted, and the densities of the holes and electrons in the first semiconductor layer 11 are increased. As a result, the forward resistance between the first electrode 20 and the second electrode 30 can be reduced, and the conduction loss can be reduced.

As shown in FIG. 4B, n-type inversion layers (not illustrated) are induced at the interface between the second semiconductor layer 13 and the first insulating film 43 and at the interface between the second semiconductor layer 13 and the third insulating film 53 when the second control voltage $V_2$, e.g., positive 15 V is applied to the first and second control electrodes 40 and 50. Ejection paths of electrons from the first semiconductor layer 11 to the first electrode 20 via the third semiconductor layers 15 and the n-type inversion layers are formed thereby. As a result, the ejection of the electrons from the first semiconductor layer 11 to the first electrode 20 is promoted, and the densities of the holes and electrons in the first semiconductor layer 11 are reduced.

In the control method according to the embodiment, the densities of the holes and electrons in the first semiconductor layer 11 are reduced directly before causing the semiconductor device RC3 to transition from the diode mode to the IGBT mode. Thereby, the time to deplete the first semiconductor layer 11 can be reduced, and the switching loss in the diode mode can be reduced.

In other words, the semiconductor device RC3 is set to the off-state at the timing of transitioning to the IGBT mode. Accordingly, the holes and electrons of the first semiconductor layer 11 are ejected respectively to the first and second electrodes 20 and 30, and the first semiconductor layer 11 is depleted. The switching loss is increased if the ejection time of the holes and electrons in this process lengthens.

In the control method according to the embodiment, the switching loss can be reduced by pre-reducing the densities of the holes and electrons in the first semiconductor layer 11. In other words, by increasing the densities of the holes and electrons in the first semiconductor layer 11, the conduction loss in the diode mode can be reduced, and the switching loss also can be reduced.

On the other hand, to avoid the short-circuit of the power supply V via the semiconductor devices RC3 and RC4, a control is performed to delay the timing (the time $t_4$) of turning on the semiconductor device RC4 to be later than the timing (the time $t_3$) of reducing the second control voltage $V_2$ applied to the first and second control electrodes 40 and 50 to be not more than the threshold voltage. Therefore, there is a risk that the densities of the holes and electrons in the first semiconductor layer 11 may increase and the switching loss may increase between the time $t_3$ and the time $t_4$.

In the control method according to the embodiment, the third control voltage $V_3$ of a level between the first control voltage $V_1$ and the second control voltage $V_2$ is applied to the semiconductor device RC3 between the time $t_3$ and the time $t_4$ (referring to FIG. 3A). Thereby, the injection of the holes and the electrons into the first semiconductor layer 11 can be suppressed, and the increase of the densities of the holes and the electrons can be suppressed.

For example, the third control voltage $V_3$ is set to a level such that a p-type inversion layer is not induced at the interface between the first semiconductor layer 11 and the first insulating film 43 or at the interface between the first semiconductor layer 11 and the third insulating film 53. The third control voltage $V_3$ also is set to a level such that an n-type inversion layer is not induced at the interface between the second semiconductor layer 13 and the first insulating film 43 or at the interface between the second semiconductor layer 13 and the third insulating film 53. Injection of the holes and the electrons into the first semiconductor layer 11 between the time $t_3$ and the time $t_4$ can be suppressed thereby (referring to FIG. 4C).

Figure 5:
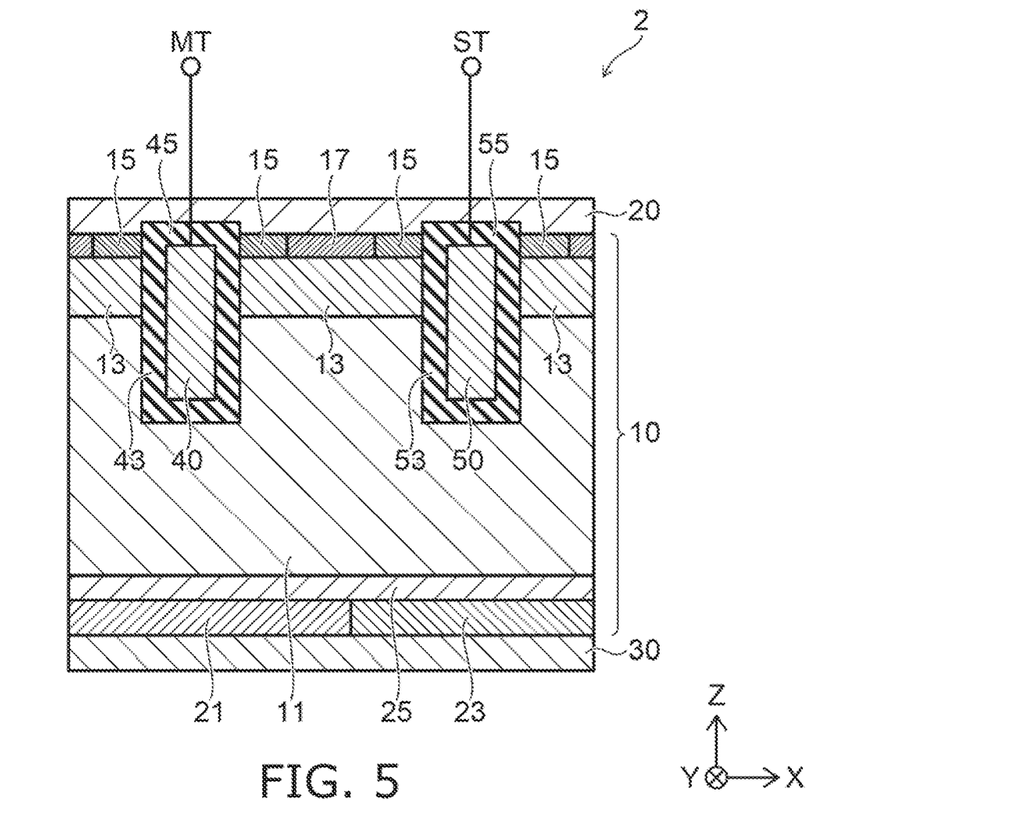
FIG. 5 is a schematic cross-sectional view showing a semiconductor device according to a modification of the embodiment.

FIG. 5 is a schematic cross-sectional view showing a semiconductor device 2 according to a modification of the embodiment. In the semiconductor device 2, the first control electrode 40 is electrically connected to the first control terminal MT, and the second control electrode 50 is electrically connected to a second control terminal ST. In the example, the second control electrode 50 is electrically isolated from the first control electrode 40 and can be independently biased.

Figure 6A:
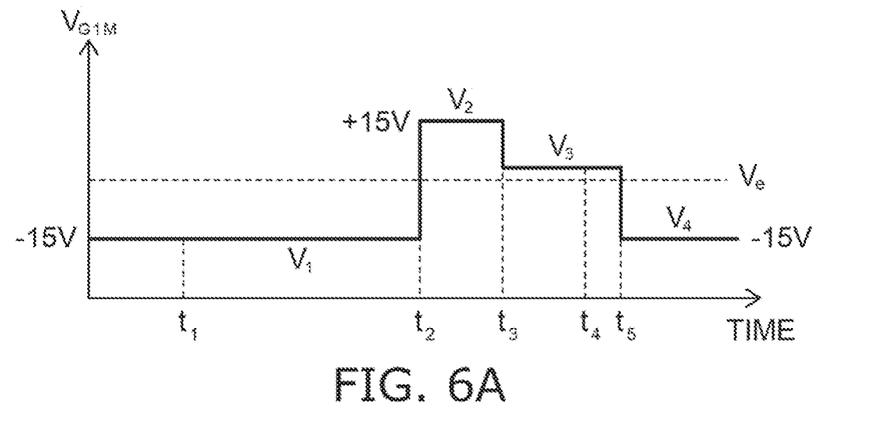
FIGS. 6A to 6C are timing charts showing a method for controlling the semiconductor device according to the modification of the embodiment.
Figure 6B:
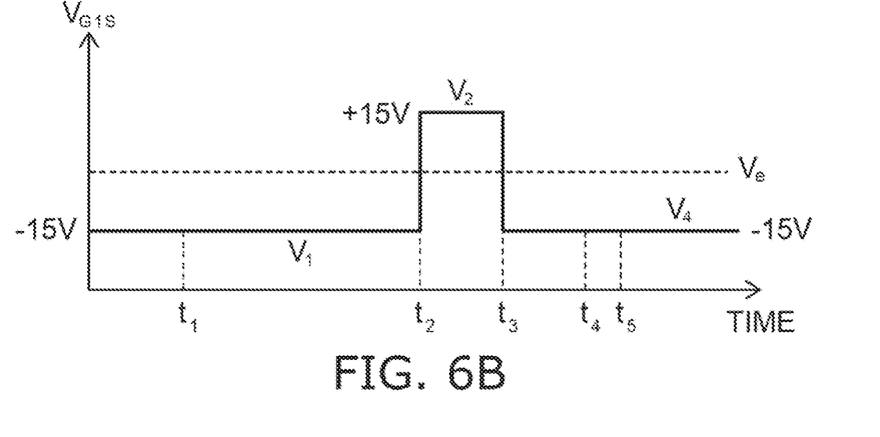
Figure 6C:
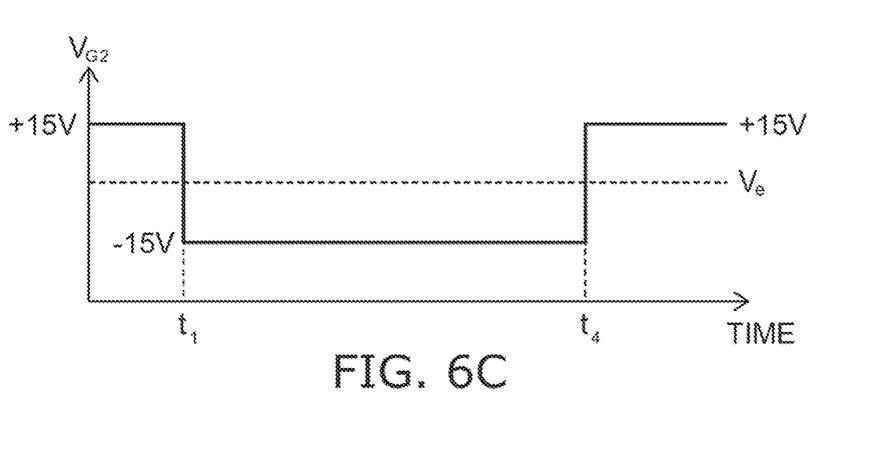

FIGS. 6A to 6C are timing charts showing a method for controlling the semiconductor device 2 according to the modification of the embodiment. In the description hereinbelow, the power conversion circuit 100 shown in FIGS. 2A and 2B is configured using the semiconductor devices 2.

FIG. 6A shows a control voltage $V_{G1M}$ that corresponds to the control voltage supplied to the first control terminal MT of the semiconductor device RC3 and is applied between the first control terminal MT and the first electrode 20.

FIG. 6B shows a control voltage $V_{G1S}$ that corresponds to the control voltage supplied to the second control terminal ST of the semiconductor device RC3 and is applied between the second control terminal ST and the first electrode 20.

FIG. 6C shows the control voltage $V_{G2}$ that corresponds to the control voltage supplied to the first and second control terminals MT and ST of the semiconductor device RC4 and is applied between the first electrode 20 and the first and second control terminals MT and ST.

As shown in FIG. 6A, the control voltage $V_{G1M}$ is maintained at the first control voltage $V_1$, e.g., negative 15 V until the time $t_2$. The control voltage $V_{G1M}$ is increased to the second control voltage $V_2$, e.g., positive 15 V at the time $t_2$ and is maintained at the second control voltage $V_2$ until the time $t_3$. At the time $t_3$, the control voltage $V_{G1M}$ is reduced to the third control voltage $V_3$, e.g., 1 to 2 V. Subsequently, at the time $t_5$, the control voltage $V_{G1M}$ is reduced to the fourth control voltage $V_4$, e.g., negative 15 V.

As shown in FIG. 6B, the control voltage $V_{G1S}$ is maintained at the first control voltage $V_1$, e.g., negative 15 V until the time $t_2$. The control voltage $V_{G1S}$ is increased to the second control voltage $V_2$, e.g., positive 15 V at the time $t_2$ and is maintained at the second control voltage $V_2$ until the time $t_3$. Subsequently, at the time $t_3$, the control voltage $V_{G1S}$ is reduced to the fourth control voltage $V_4$, e.g., negative 15 V.

As shown in FIG. 6C, the control voltage $V_{G2}$ is maintained at, for example, positive 15 V until the time $t_1$ which is before the time $t_2$, and is reduced to, for example, negative 15 V at the time $t_1$. Subsequently, the control voltage $V_{G2}$ is maintained at, for example, negative 15 V until the time $t_4$ which is between the time $t_3$ and the time $t_5$, and is increased to positive 15 V at the time $t_4$. In other words, the semiconductor device RC4 is controlled to be turned off at the time $t_1$ and turned on at the time $t_4$.

As shown in FIGS. 6A and 6B, the first control voltage $V_1$ is applied to the first and second control electrodes 40 and 50 of the semiconductor device RC3 until the time $t_2$. Meanwhile, the semiconductor device RC4 is turned off at the time $t_1$, and the semiconductor device RC3 transitions to the diode mode. In other words, in the semiconductor device RC3, the hole injection from the second semiconductor layer 13 into the first semiconductor layer 11 is promoted between the time $t_1$ and the time $t_2$ (referring to FIG. 4A). Thereby, the densities of the holes and electrons in the first semiconductor layer 11 is increased, and the conduction loss of the semiconductor device RC3 is reduced.

Continuing, between the time $t_2$ and the time $t_3$, the second control voltage $V_2$ is applied to the first and second control electrodes 40 and 50 of the semiconductor device RC3, and the ejection of the electrons from the first semiconductor layer 11 to the first electrode 20 is promoted (referring to FIG. 4B). The densities of the holes and electrons in the first semiconductor layer 11 can be reduced thereby.

Subsequently, the third control voltage $V_3$ is applied to the first control electrode 40, the injection of the holes into the first semiconductor layer 11 is suppressed, and the ejection of the electrons from the first semiconductor layer 11 to the first electrode 20 is suppressed. On the other hand, the fourth control voltage $V_4$ is applied to the second control electrode 50, and the ejection of the electrons from the first semiconductor layer 11 into the first electrode 20 is suppressed. On the other hand, a p-type inversion layer is induced at the interface between the first semiconductor layer 11 and the third insulating film 53 by the potential of the second control electrode 50, and the injection of holes into the first semiconductor layer 11 is promoted.

In the example, the increase of the densities of the holes and electrons in the first semiconductor layer 11 between the time $t_3$ and the time $t_4$ is suppressed by the third control voltage $V_3$ applied to the first control electrode 40. Also, when the densities of the holes and the electrons excessively decrease between the time $t_2$ and the time $t_3$, the hole injection is promoted by applying the fourth control voltage $V_4$ to the second control electrode 50 between the time $t_3$ and the time $t_4$. The density decrease of the holes and the electrons can be compensated thereby.

In the control method shown in FIGS. 6A to 6C, it is unnecessary for the control voltage applied between the first control terminal MT and the first electrode 20 to be equal to the control voltage applied between the second control terminal ST and the first electrode 20; for example, the first control voltage $V_1$ between the first control terminal MT and the first electrode 20 and the first control voltage $V_1$ between the second control terminal ST and the first electrode 20 may be different. Also, the second control voltage $V_2$ between the first control terminal MT and the first electrode 20 and the second control voltage $V_2$ between the second control terminal ST and the first electrode 20 may be different.

Figure 7:
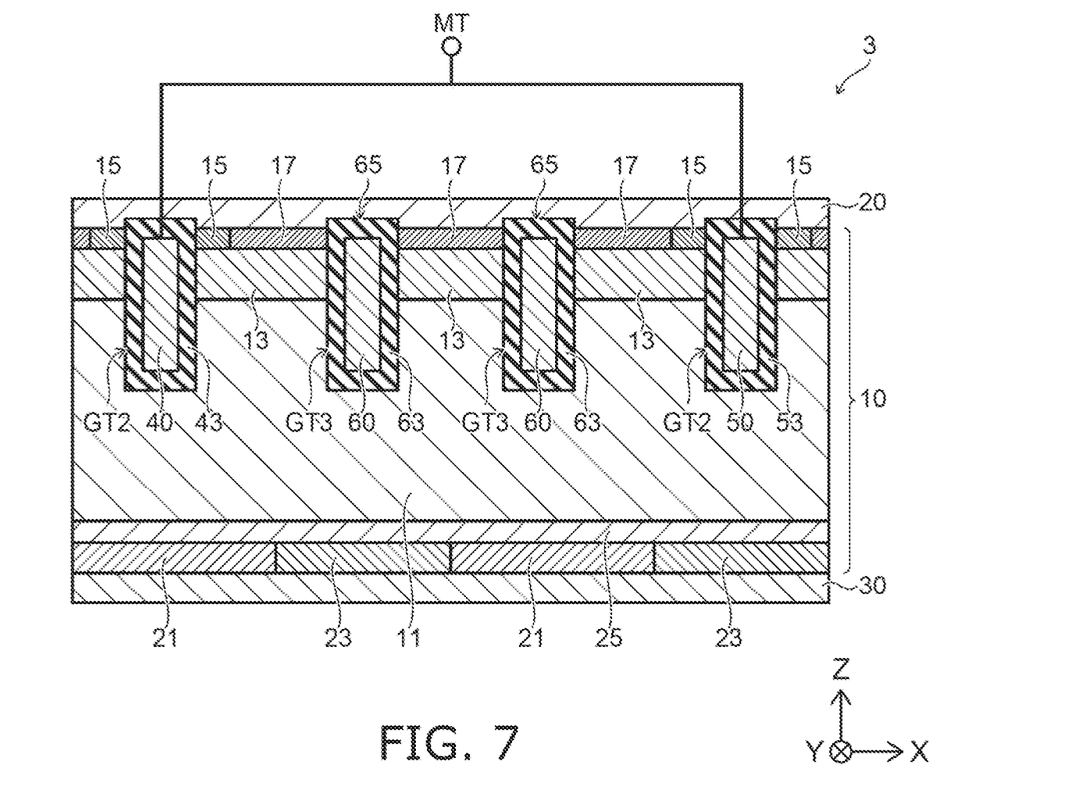
FIG. 7 is a schematic cross-sectional view showing a semiconductor device according to another modification of the embodiment.

FIG. 7 is a schematic cross-sectional view showing a semiconductor device 3 according to another modification of the embodiment. In the semiconductor device 3, at least one third control electrode 60 is provided between the first control electrode 40 and the second control electrode 50.

The third control electrode 60 is disposed inside a third trench GT3 provided at the first surface 10A side of the semiconductor part 10 and is electrically insulated from the semiconductor part 10 by a fifth insulating film 63. The fifth insulating film 63 is, for example, a silicon oxide film.

For example, the third control electrode 60 is electrically connected to the first electrode 20. For example, a sixth insulating film 65 is provided between the first electrode 20 and the third control electrode 60. The sixth insulating film 65 is, for example, a silicon oxide film. The first electrode 20 is electrically connected to the third control electrode 60 via a contact that extends through the sixth insulating film 65 and reaches the third control electrode 60. The third control electrode 60 is electrically isolated (insulated) from the first and second control electrodes 40 and 50 and is independently biased.

By disposing the third control electrode 60 in the semiconductor device 3, for example, the excessive ejection of the electrons from the first semiconductor layer 11 to the first electrode 20 in the operation of the diode mode shown in FIG. 2B can be suppressed.

In the diode mode of the semiconductor device 1 or 2 as described above, n-type inversion layers are induced at the interface between the second semiconductor layer 13 and the first insulating film 43 and at the interface between the second semiconductor layer 13 and the third insulating film 53 by applying a control voltage that is not less than the threshold voltage to the first and second control electrodes 40 and 50. Thereby, the ejection of the electrons from the first semiconductor layer 11 to the first electrode 20 is promoted, and the densities of the holes and the electrons are reduced. At this time, the conduction loss is increased if the electrons are excessively ejected from the first semiconductor layer 11. There is also a risk that the forward voltage may increase, and element breakdown may occur.

By disposing the third control electrode 60 in the semiconductor device 3, the excessive ejection of the electrons from the first semiconductor layer 11 to the first electrode 20 can be suppressed, and the excessive decrease of the densities of the holes and the electrons can be avoided. Thereby, the first control electrode 40 and the second control electrode 50 can be appropriately controlled, the conduction loss can be reduced, and the switching loss also can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for controlling a semiconductor device, the semiconductor device including:
   a semiconductor part provided between a first electrode and a second electrode;
   at least a control electrode being provided between the semiconductor part and the first electrode;
   a first insulating film provided between the semiconductor part and the control electrode; and
   a second insulating film provided between the first electrode and the control electrode;
   the semiconductor part including first to fifth semiconductor layers, the first, third and fifth semiconductor layers being of a first conductivity type, the second and fourth semiconductor layers being of a second conductivity type, the second semiconductor layer being provided between the first semiconductor layer and the first electrode, the second semiconductor layer including a portion facing the control electrode via the first insulating film, the third semiconductor layer being provided between the second semiconductor layer and the first electrode, the third semiconductor layer contacting the first insulating film, the fourth semiconductor layer being provided between the first semiconductor layer and the second electrode, the fifth semiconductor layer being provided between the first semiconductor layer and the second electrode, the fourth and fifth semiconductor layers being arranged along the second electrode, the first electrode being electrically connected to the second and third semiconductor layers, the second electrode being electrically connected to the fourth and fifth semiconductor layers, the method comprising:
applying a first control voltage between the first electrode and the control electrode in a first period;
applying a second control voltage between the first electrode and the control electrode in a second period after the first period, the second control voltage being greater than the first control voltage; and
applying a third control voltage between the first electrode and the control electrode in a third period after the second period, the third control voltage being greater than the first control voltage and less than the second control voltage.

2. The method according to claim 1, wherein
the first control voltage is a negative voltage with respect to a potential of the first electrode, and
the second control voltage is a positive voltage with respect to the potential of the first electrode.

3. The method according to claim 2, wherein
an absolute value of the first control voltage is equal to an absolute value of the second control voltage.

4. The method according to claim 1, wherein
the second control voltage is applied so that a potential difference between the control electrode and the first electrode is greater than a threshold voltage of the control electrode.

5. The method according to claim 1, wherein
the third control voltage is less than a threshold voltage of the control electrode.

6. The method according to claim 5, wherein
the third control voltage is a positive voltage.

7. The method according to claim 1, wherein
a p-n junction is provided between the first semiconductor layer and the second semiconductor layer, the p-n junction being biased in a forward direction before the first period and during the first to third periods and being biased in a reverse direction after the third period.

8. The method according to claim 7, wherein
the third control voltage is continually applied between the first electrode and the control electrode after the p-n junction is biased in the reverse direction at an end of the third period.

9. The method according to claim 8, wherein
the third control voltage is continually applied between the first electrode and the control electrode in a fourth period after the third period, and
the first control voltage is applied between the first electrode and the control electrode at an end of the fourth period.

10. The method according to claim 1, wherein
the semiconductor device includes a plurality of the control electrodes, the control electrodes including first and second control electrodes;
the first to third control voltages are applied to the first control electrode in the first to third periods, respectively, and
the first and second control voltages are applied between the first electrode and the second control electrode in the first and second periods, respectively, and
a fourth control voltage is applied between the second control electrode and the first electrode in the third period, the fourth control voltage being less than the third control voltage.

11. The method according to claim 10, wherein
the fourth control voltage is equal to the first control voltage.

12. The method according to claim 10, wherein
a p-n junction is provided between the first semiconductor layer and the second semiconductor layer, the p-n junction being biased in a forward direction before the first period and during the first to third periods and being biased in a reverse direction after the third period; and
the fourth control voltage is continually applied between the first electrode and the second control electrode after the p-n junction is biased in the reverse direction at an end of the third period.

13. The method according to claim 10, wherein
the first control voltage applied between the first electrode and the first control electrode is different from the first control voltage applied between the first electrode and the second control electrode, and
the second control voltage applied between the first electrode and the first control electrode is different from the second control voltage applied between the first electrode and the second control electrode.

14. The method according to claim 13, wherein
the control electrodes include two or more of the third control electrodes, and
the two or more of the third control electrodes are provided between the first control electrode and the second control electrode.

15. The method according to claim 1, wherein
the semiconductor device includes a plurality of the control electrodes, the control electrodes including first to third control electrodes;
the third control electrode is provided between the first control electrode and the second control electrode;
the first to third control voltages are applied between the first electrode and the first control electrode and between the first electrode and the second control electrode, the first to third control voltages being applied in the first to third periods, respectively, and
the third control electrode is maintained at a potential same as a potential of the first electrode in the first to third periods.

16. A method for controlling a power conversion device, the power conversion device including a plurality of semiconductor devices, each of the plurality of semiconductor devices including:
a semiconductor part provided between a first electrode and a second electrode;
at least a control electrode provided between the semiconductor part and the first electrode,
a first insulating film provided between the semiconductor part and the control electrode; and a second insulating film provided between the first electrode and the control electrode;

the semiconductor part including first to fifth semiconductor layers, the first, third and fifth semiconductor layers being of a first conductivity type, the second and fourth semiconductor layers being of a second conductivity type, the second semiconductor layer being provided between the first semiconductor layer and the first electrode and including a portion facing the control electrode via the first insulating film, the third semiconductor layer being provided between the second semiconductor layer and the first electrode, the third semiconductor layer contacting the first insulating film, the fourth semiconductor layer being provided between the first semiconductor layer and the second electrode, the fifth semiconductor layer being provided between the first semiconductor layer and the second electrode, the fourth and fifth semiconductor layers being arranged along the second electrode, the first electrode being electrically connected to the second and third semiconductor layers, the second electrode being electrically connected to the fourth and fifth semiconductor layers, the plurality of semiconductor devices including first and second semiconductor devices connected in series, the method comprising:

biasing the first semiconductor device in a forward direction at a first timing by turning off the second semiconductor device while, in the first semiconductor device, a first control voltage is applied between the first electrode and the control electrode, the first control voltage being less than a threshold voltage of the control electrode, the second semiconductor device being turned off by reducing a control voltage of the second semiconductor device applied between the first electrode and the control electrode, the control voltage of the second semiconductor device being reduced from a second control voltage to the first control voltage, the second control voltage being greater than the threshold voltage of the control electrode;

increasing a control voltage of the first semiconductor device applied between the first electrode and the control electrode, the control voltage of the first semiconductor device being increased from the first control voltage to the second control voltage at a second timing after the first timing;

reducing the control voltage of the first semiconductor device from the second control voltage to a third control voltage at a third timing after the second timing, the third control voltage being greater than the first control voltage and less than the second control voltage; and turning on the second semiconductor device at a fourth timing after the third timing by increasing the control voltage of the second semiconductor device from the first control voltage to the second control voltage.

17. The method according to claim 16, wherein
the first control voltage is a negative voltage with respect to a potential of the first electrode, and
the second control voltage is a positive voltage with respect to the potential of the first electrode.

18. The method according to claim 16, wherein
the third control voltage is a positive voltage less than the threshold voltage of the control electrode.

19. The method according to claim 16, wherein
the control voltage of the first semiconductor device is reduced from the third control voltage to a fourth control voltage at a fifth timing after the fourth timing, the fourth control voltage being less than the third control voltage.

20. The method according to claim 19, wherein
the fourth control voltage is equal to the first control voltage.

* * * * *